United States Patent
Chang et al.

(10) Patent No.: US 10,062,656 B2
(45) Date of Patent: Aug. 28, 2018

(54) COMPOSITE BOND STRUCTURE IN STACKED SEMICONDUCTOR STRUCTURE

(71) Applicant: TAIWAN SEMICONDUCTOR MANUFACTURING CO., LTD., Hsinchu (TW)

(72) Inventors: Chao-Ching Chang, Kaohsiung (TW); Sheng-Chan Li, Tainan (TW); Wen-Jen Tsai, Tainan (TW); Chih-Hui Huang, Tainan (TW); Jian-Shin Tsai, Tainan (TW); Cheng-Yi Wu, Taichung (TW); Yi-Ming Lin, Tainan (TW); Min-Hui Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/236,526

(22) Filed: Aug. 15, 2016

(65) Prior Publication Data
US 2018/0047682 A1    Feb. 15, 2018

(51) Int. Cl.
*H01L 23/00*    (2006.01)

(52) U.S. Cl.
CPC .............. *H01L 24/02* (2013.01); *H01L 24/05* (2013.01); *H01L 24/08* (2013.01); *H01L 2224/024* (2013.01); *H01L 2224/0226* (2013.01); *H01L 2224/0237* (2013.01); *H01L 2224/0239* (2013.01); *H01L 2224/02251* (2013.01); *H01L 2224/02331* (2013.01); *H01L 2224/03011* (2013.01); *H01L 2224/05547* (2013.01); *H01L 2224/05583* (2013.01); *H01L 2224/05624* (2013.01); *H01L 2224/05647* (2013.01);

(Continued)

(58) Field of Classification Search
CPC ......... H01L 24/02; H01L 24/05; H01L 24/08; H01L 2224/02251; H01L 2224/0226; H01L 2224/02331; H01L 2224/0237; H01L 2224/0239; H01L 2224/024; H01L 2224/03011; H01L 2224/05547; H01L 2224/05583; H01L 2224/05624; H01L 2224/05647; H01L 2224/08145
See application file for complete search history.

(56) References Cited

U.S. PATENT DOCUMENTS 6,828,248 B1 * 12/2004 Tao ..................... H01L 21/3081
257/E21.232
2008/0102379 A1 * 5/2008 Wu ........................... G03F 1/26
430/5

(Continued)

*Primary Examiner* — Peter Bradford
(74) *Attorney, Agent, or Firm* — McClure, Qualey & Rodack, LLP

(57) ABSTRACT

A semiconductor device includes a substrate, a dielectric structure, a top metal layer and a bonding structure. The dielectric structure is disposed on the substrate. The top metal layer is disposed in the dielectric structure. The bonding structure is disposed on the dielectric structure and the top metal layer. The bonding structure includes a silicon oxide layer, a silicon oxy-nitride layer, a conductive bonding layer and a barrier layer. The silicon oxide layer is disposed on the dielectric structure. The silicon oxy-nitride layer covers the silicon oxide layer. The conductive bonding layer is disposed in the silicon oxide layer and the silicon oxy-nitride layer. The barrier layer covers a sidewall and a bottom of the conductive bonding layer.

20 Claims, 6 Drawing Sheets

(52) U.S. Cl.
CPC ........... *H01L 2224/08145* (2013.01); *H01L 2924/01013* (2013.01); *H01L 2924/01029* (2013.01); *H01L 2924/0504* (2013.01); *H01L 2924/059* (2013.01); *H01L 2924/0544* (2013.01); *H01L 2924/05442* (2013.01)

(56) References Cited

U.S. PATENT DOCUMENTS

2015/0108644 A1* 4/2015 Kuang .................... H01L 24/06
257/751
2015/0228580 A1* 8/2015 Chen ...................... H01L 24/27
257/531

* cited by examiner

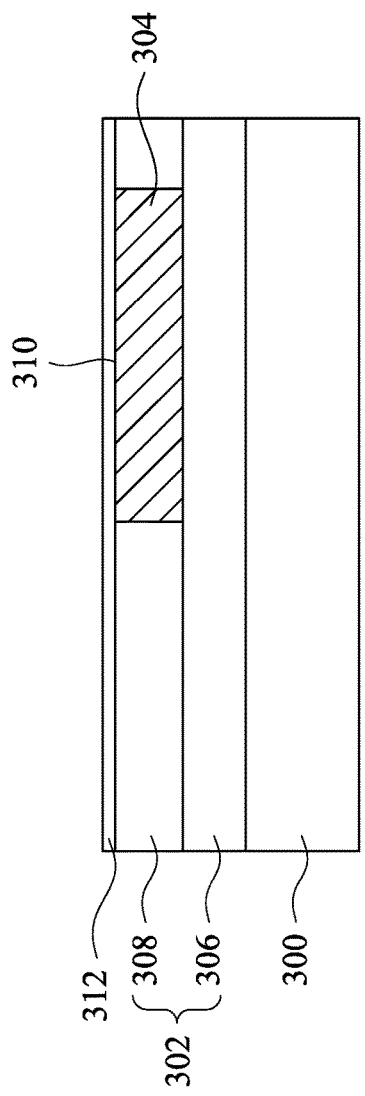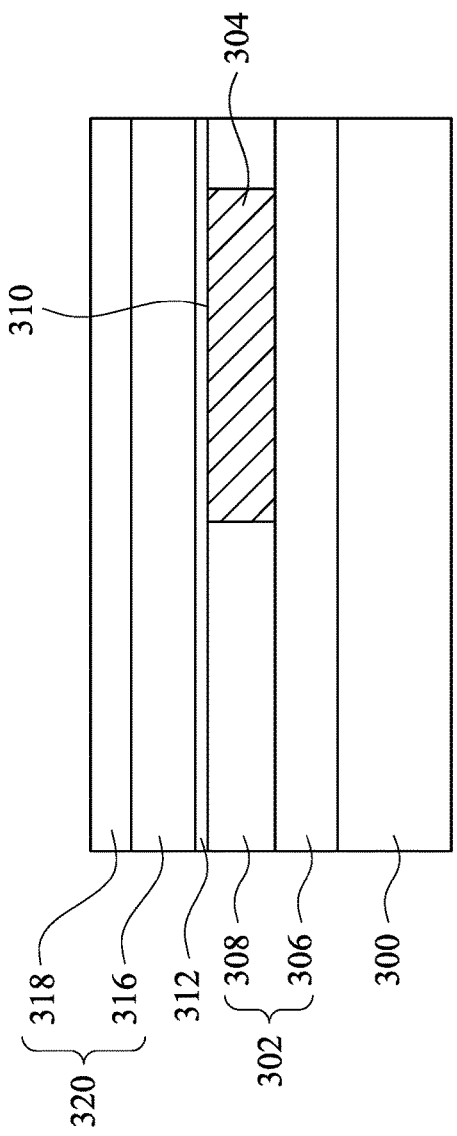

COMPOSITE BOND STRUCTURE IN STACKED SEMICONDUCTOR STRUCTURE

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) vertical integration techniques. A wafer level stacking technique is one of the three-dimensional vertical integration techniques, which bonds two wafer structure by using bond structures. However, conventional bond structures and methods of fabricating the bond structures have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A through FIG. 3D are schematic cross-sectional views of intermediate stages showing a method for manufacturing a semiconductor device in accordance with various embodiments.

DETAILED DESCRIPTION

Figure 1:
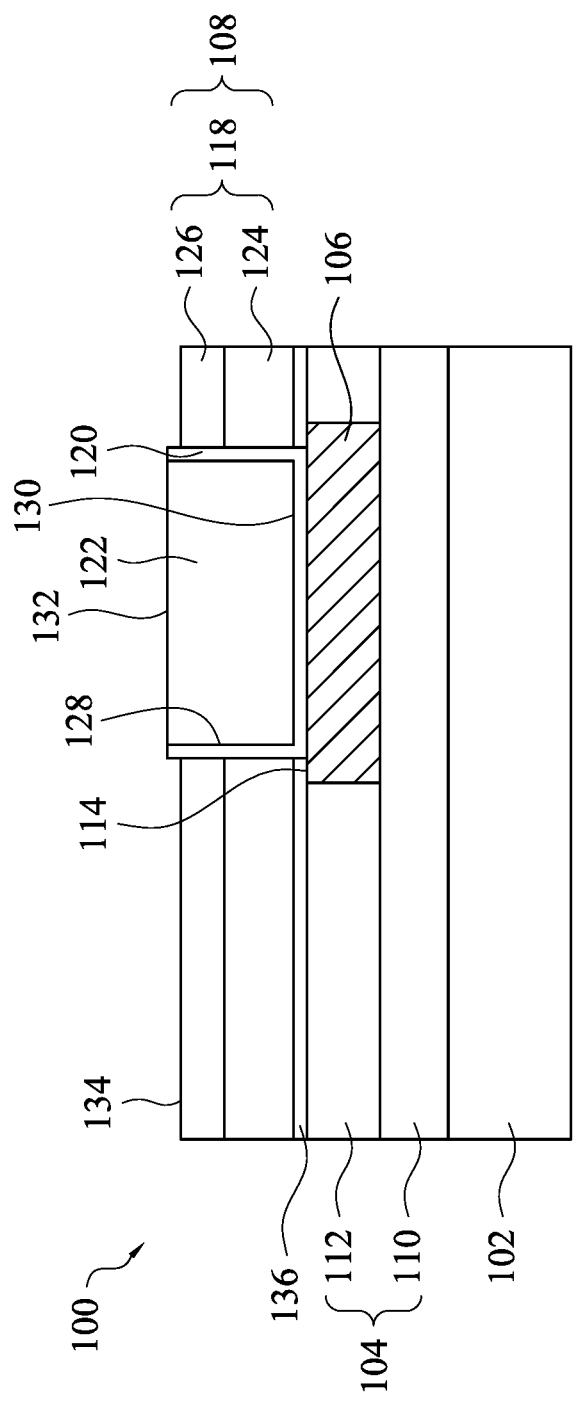
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

A typical bonding structure of a semiconductor structure in a stacked semiconductor device includes a conductive bonding layer, an insulation layer and a barrier layer, in which the conductive bonding layer is embedded in the insulation layer and passes through the insulation layer, and the barrier layer is disposed between the conductive bonding layer and the insulation layer. The insulation layer is typically formed from polymer, such that after two semiconductor structures are bonded together, materials of the conductive bonding layers diffuse to the insulation layers along an interface of the conductive bonding layers. Thus, electrical reliability of the stacked semiconductor device is reduced.

Embodiments of the present disclosure are directed to providing a semiconductor device and a method for manufacturing the semiconductor device, in which a bonding structure of a semiconductor structure includes a composite insulation structure, a barrier layer and a conductive bonding layer, the conductive bonding layer is embedded in the composite insulation structure, and the barrier layer is lined between the composite insulation structure and the conductive bonding layer. A top layer of the composite insulation structure is a nitrogen-containing layer, such that after two semiconductor structures are bonded together, the composite insulation structures can effectively prevent materials of the conductive bonding layers from diffusing to the composite insulation structure along an interface of the conductive bonding layers.

In addition, with the top layer of the composite insulation structure, uniformity of a bonding area on the composite insulation structure and the conductive bonding layer is improved after a planarization process which is performed to planarize the conductive bonding layer and the composite insulation structure, such that a bonding effect of the semiconductor structures is enhanced. Furthermore, a lower layer of the composite insulation structure may be formed by a high density plasma chemical vapor deposition (HDP CVD) method, such that the lower layer is denser, and the lower layer has less water content, such that adhesion of the bonded semiconductor structures is increased.

FIG. 1 is a schematic cross-sectional view of a semiconductor device in accordance with various embodiments. In some embodiments, as shown in FIG. 1, a semiconductor device 100 includes a substrate 102, a dielectric structure 104, a top metal layer 106 and a bonding structure 108. The substrate 102 may be a semiconductor substrate. The substrate 102 may be composed of a single-crystalline semiconductor material or a compound semiconductor material. For example, silicon or germanium may be used as a material forming the substrate 102. In some exemplary examples, the substrate 102 is composed of silicon.

The dielectric structure 104 is disposed on the substrate 102. In some examples, the dielectric structure 104 includes various dielectric layers, which are stacked in sequence. In some exemplary examples, as shown in FIG. 1, the dielectric structure 104 includes at least two dielectric layers 110 and 112, in which the dielectric layer 110 is disposed on the substrate 102, and the dielectric layer 112 is disposed on the dielectric layer 110. The dielectric layers 110 and 112 may be formed from silicon nitride, silicon carbide, silicon oxide, a low dielectric constant dielectric material, or combinations thereof.

In some examples, the dielectric layer 110 may include various dielectric films stacked on each other. In some exemplary examples, the semiconductor device 100 may include various metal layers and various vias, in which the metal layers and the vias may be disposed in the dielectric films, and the vias may be disposed between the metal layers to electrically connect the metal layers. The metal layers and the vias may be formed from copper, aluminum, or alloys thereof.

Referring to FIG. 1 again, the top metal layer 106 is disposed in the dielectric layer 112 of the dielectric layer structure 104. In some exemplary examples, a top surface 114 of the top metal layer 106 is not covered by the dielectric layer 112. The top metal layer 106 may be formed from copper, aluminum, or alloys thereof.

The bonding structure 108 is disposed on the dielectric layer 112 of the dielectric structure 104 and the top metal layer 106. In some examples, the bonding structure 108 includes a composite insulation structure 118, a barrier layer 120 and a conductive bonding layer 122. The composite insulation structure 118 is disposed on the dielectric layer 112 of the dielectric structure 104 and a periphery of the top metal layer 106.

In some exemplary examples, the composite insulation structure 118 includes a silicon oxide layer 124 and a silicon oxy-nitride layer 126, in which the silicon oxide layer 124 is disposed on the dielectric layer 112 of the dielectric structure 104, and the silicon oxy-nitride layer 126 is disposed on and covers the silicon oxide layer 124. In some embodiments, the silicon oxide layer 124 may have a thickness of about 3000 angstroms, and the silicon oxy-nitride layer 126 may have a thickness of about 750 angstroms. The silicon oxy-nitride layer 126 may have a reflectivity ranging from about 2.0 to about 2.4. The silicon oxy-nitride layer 126 may have an extinction coefficient ranging from about 0.4 to about 0.6.

Referring to FIG. 1 again, the conductive bonding layer 122 is disposed in the silicon oxide layer 124 and the silicon oxy-nitride layer 126. In some exemplary examples, the conductive bonding layer 122 is a redistribution layer. The conductive bonding layer 122 may be formed from copper, aluminum, or alloys thereof. A top surface 132 of the conductive bonding layer 122 is at a first elevation, and a top surface 134 of the silicon oxy-nitride layer 126 is at a second elevation. The first elevation may be higher than or lower than the second elevation. In some exemplary examples, a result of the first elevation minus the second elevation ranges from about −50 angstroms to about 100 angstroms. In certain examples, a result of first elevation minus the second elevation ranges from about −30 angstroms to about 50 angstroms. While the result of the first elevation minus the second elevation is positive, the first elevation is higher than the second elevation; and while the result of the first elevation minus second elevation is negative, the first elevation is lower than the second elevation.

In the shown embodiment, the barrier layer 120 is disposed in the silicon oxide layer 124 and the silicon oxy-nitride layer 126, and conformally covers a sidewall 128 and a bottom 130 of the conductive bonding layer 122, such that the barrier layer 120 is disposed between the conductive bonding layer 122 and the top metal layer 106, between the conductive bonding layer 122 and the silicon oxide layer 124, and between the conductive bonding layer 122 and the silicon oxy-nitride layer 126. In addition, the barrier layer 120 contacts with the top metal layer 106, the silicon oxide layer 124, and the silicon oxy-nitride layer 126. The barrier layer 120 may be formed from a compound including metal and nonmetal. In some embodiments, the barrier layer 120 has a thickness of about 200 angstroms.

In some examples, as shown in FIG. 1, the semiconductor device 100 may optionally include an etch stop layer 136, which is disposed between the dielectric layer 112 of the dielectric structure 104 and the bonding structure 108. The barrier layer 120 is disposed in the etch stop layer 136, such that the barrier layer 120 contacts with the etch stop layer 136. The etch stop layer 136 may be formed from silicon nitride. The etch stop layer 136 may have a thickness ranging from about 300 angstroms to about 750 angstroms.

A top layer of the composite insulation structure 118 is the silicon oxy-nitride layer 126, which is a nitrogen-containing layer, such that after the semiconductor device 100 is bonded to another semiconductor device, the silicon oxy-nitride layer 126 of the composite insulation structure 118 can effectively prevent a material of the conductive bonding layer 122 from diffusing to the composite insulation structure 118 along an interface of the conductive bonding layer 122 and another conductive bonding layer.

Moreover, the silicon oxide layer 124 of the composite insulation structure 118 may be a high density plasma chemical vapor deposition layer, such that the silicon oxide layer 124 is denser. The denser silicon oxide layer 124 has less water content, which may increase adhesion of the semiconductor device 100 and another semiconductor bonded thereto.

Figure 2:
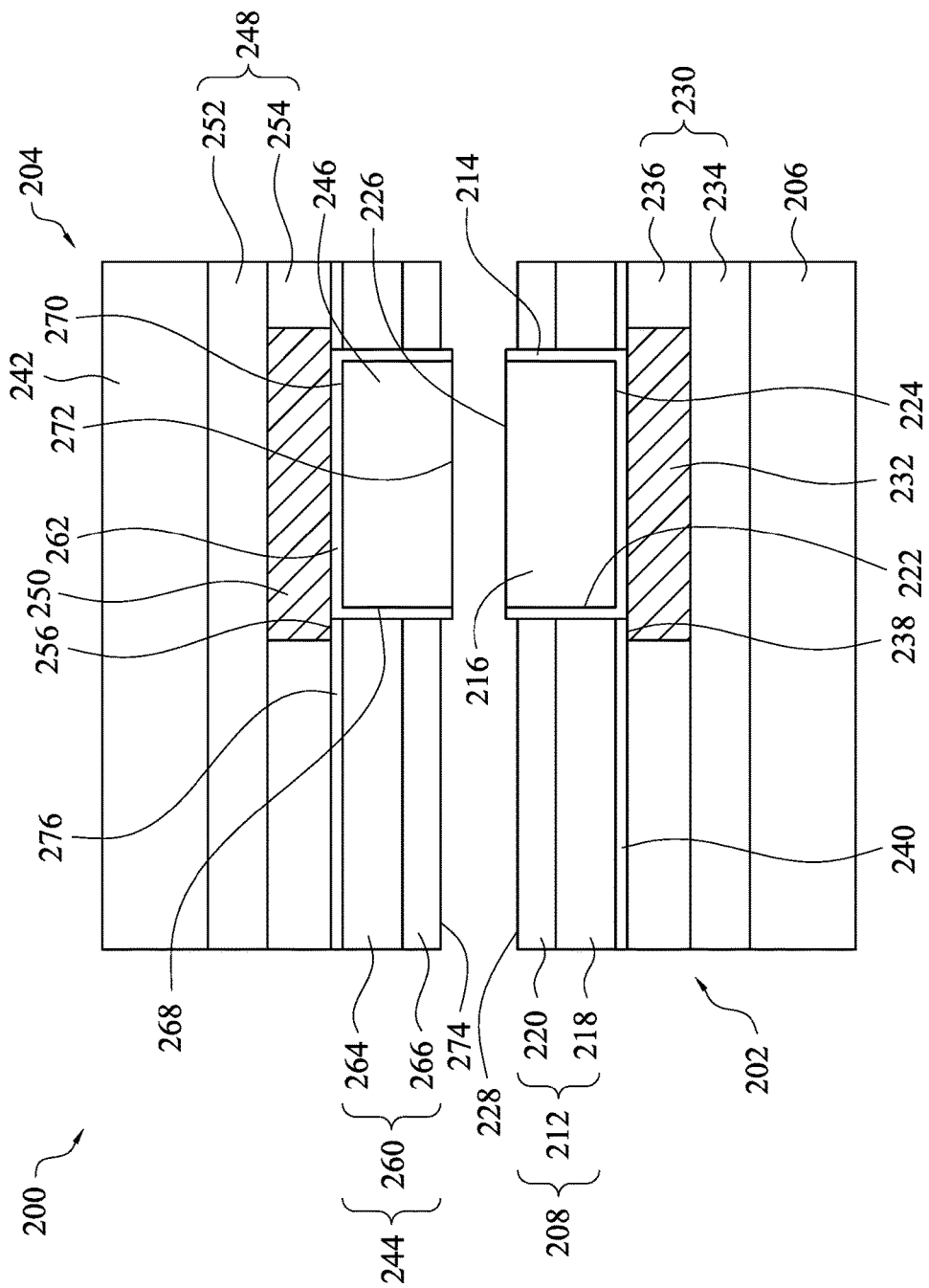
FIG. 2 is a schematic cross-sectional view of a semiconductor device in accordance with various embodiments.

FIG. 2 is a schematic cross-sectional view of a semiconductor device in accordance with various embodiments. In some embodiments, as shown in FIG. 2, a semiconductor device 200 includes a first semiconductor structure 202 and a second semiconductor structure 204. The first semiconductor structure 202 and the second semiconductor structure 204 are bonded together to form the semiconductor device 200. Each of the first semiconductor structure 202 and the second semiconductor structure 204 may be a semiconductor wafer, on which various devices and interconnects may be formed.

Referring to FIG. 2 again, in some examples, the first semiconductor structure 202 includes a first substrate 206 and a first bonding structure 208. The first substrate 206 may be a semiconductor substrate. The first substrate 206 may be composed of a single-crystalline semiconductor material or a compound semiconductor material. For example, silicon or germanium may be used as a material forming the first substrate 206. In some exemplary examples, the first substrate 206 is composed of silicon.

The first bonding structure 208 is disposed over the first substrate 206. In some examples, the first bonding structure 208 includes a first composite insulation structure 212, a first barrier layer 214 and a first conductive bonding layer 216. The first composite insulation structure 212 is disposed over the first substrate 206. In some examples, the first composite insulation structure 212 includes a first silicon oxide layer 218 and a first silicon oxy-nitride layer 220, in which the first silicon oxide layer 218 is disposed over the first substrate 206, and the first silicon oxy-nitride layer 220 is disposed on and covers the first silicon oxide layer 218. In some embodiments, the first silicon oxide layer 218 may have a thickness of about 3000 angstroms, and the first silicon oxy-nitride layer 220 may have a thickness of about 750 angstroms. The first silicon oxy-nitride layer 220 may have a reflectivity ranging from about 2.0 to about 2.4. The first silicon oxy-nitride layer 220 may have an extinction coefficient ranging from about 0.4 to about 0.6.

As shown in FIG. 2, the first conductive bonding layer 216 is disposed in the first silicon oxide layer 218 and the first silicon oxy-nitride layer 220. In some exemplary examples, the first conductive bonding layer 216 is a redistribution layer. The first conductive bonding layer 216 may be formed from copper, aluminum, or alloys thereof. A top surface 226 of the first conductive bonding layer 216 is at a first elevation, and a top surface 228 of the first silicon oxy-nitride layer 220 is at a second elevation. In some exemplary examples, a result of the first elevation minus the second elevation ranges from about −50 angstroms to about 100 angstroms. In certain examples, a result of the first elevation minus the second elevation ranges from about −30 angstroms to about 50 angstroms. While the result of the first elevation minus the second elevation is positive, the first elevation is higher than the second elevation; and while the result of the first elevation minus the second elevation is negative, the first elevation is lower than the second elevation.

In the shown embodiment, the first barrier layer 214 is disposed in the first silicon oxide layer 218 and the first silicon oxy-nitride layer 220, and conformally covers a sidewall 222 and a bottom 224 of the first conductive bonding layer 216, such that the first barrier layer 214 is disposed between the first conductive bonding layer 216 and the first silicon oxide layer 218, and between the first conductive bonding layer 216 and the first silicon oxy-nitride layer 220. The first barrier layer 214 contacts with the first silicon oxide layer 218 and the first silicon oxy-nitride layer 220. The first barrier layer 214 may be formed from a compound including metal and nonmetal. In some embodiments, the first barrier layer 214 may have a thickness of about 200 angstroms.

In some examples, as shown in FIG. 2, the first semiconductor structure 202 may optionally include a first dielectric structure 230 and a first top metal layer 232. The first dielectric structure 230 is disposed on the first substrate 206. In some example, the first dielectric structure 230 includes various dielectric layers, which are stacked in sequence. In some exemplary examples, as shown in FIG. 2, the first dielectric structure 230 includes at least two dielectric layers 234 and 236, in which the dielectric layer 234 is disposed on the first substrate 206, and the dielectric layer 236 is disposed on the dielectric layer 234. The dielectric layers 234 and 236 may be formed from silicon nitride, silicon carbide, silicon oxide, a low dielectric constant dielectric material, or combinations thereof.

In some examples, the dielectric layer 234 may include various dielectric films stacked on each other. In some exemplary examples, the first semiconductor structure 202 may include various metal layers and various vias, in which the metal layers and the vias may be disposed in the dielectric films, and the vias may be disposed between the metal layers to electrically connect the metal layers. The metal layers and the vias may be formed from copper, aluminum, or alloys thereof.

Referring to FIG. 2 again, the first top metal layer 232 is disposed in the dielectric layer 236 of the first dielectric layer structure 230. In some exemplary examples, a top surface 238 of the first top metal layer 232 is not covered by the dielectric layer 236. The first top metal layer 232 may be formed from copper, aluminum, or alloys thereof. The first bonding structure 208 is disposed on the first dielectric structure 230 and the first top metal layer 232. The first barrier layer 214 is disposed between the first conductive bonding layer 216 and the top metal layer 232, such that the first barrier layer 214 contacts with the top metal layer 232.

In some examples, as shown in FIG. 2, the first semiconductor structure 202 may optionally include a first etch stop layer 240, which is disposed between the dielectric layer 234 of the first dielectric structure 230 over the first substrate 206 and the first bonding structure 208. The first barrier layer 214 is disposed in the first etch stop layer 240, such that the first barrier layer 214 contacts with the first etch stop layer 240. The first etch stop layer 240 may be formed from silicon nitride. The first etch stop layer 240 may have a thickness ranging from about 300 angstroms to about 750 angstroms.

Referring to FIG. 2 again, in some examples, the second semiconductor structure 204 includes a second substrate 242 and a second bonding structure 244. The second substrate 242 may be a semiconductor substrate. The second substrate 242 may be composed of a single-crystalline semiconductor material or a compound semiconductor material. For example, silicon or germanium may be used as a material forming the second substrate 242. In some exemplary examples, the second substrate 242 is composed of silicon.

The second bonding structure 244 is bonded to the first conductive bonding layer 216 of the first semiconductor structure 202. The second bonding structure 244 is disposed over the second substrate 242. The second bonding structure 244 includes a second conductive bonding layer 246. The second conductive bonding layer 246 is disposed in the second bonding structure 244 and is bonded to the first conductive bonding layer 216.

In some examples, the second semiconductor structure 204 may optionally include a second dielectric structure 248 and a second top metal layer 250. The second dielectric structure 248 is disposed on the second substrate 242. In some examples, the second dielectric structure 248 includes various dielectric layers, which are stacked in sequence. In some exemplary examples, as shown in FIG. 2, the second dielectric structure 248 includes at least two dielectric layers 252 and 254, in which the dielectric layer 252 is disposed on the second substrate 242, and the dielectric layer 254 is disposed on the dielectric layer 252. The dielectric layers 252 and 254 may be formed from silicon nitride, silicon carbide, silicon oxide, a low dielectric constant dielectric material, or combinations thereof.

In some examples, the dielectric layer 252 may include various dielectric films stacked on each other. In some exemplary examples, the second semiconductor structure 204 may include various metal layers and various vias, in which the metal layers and the vias may be disposed in the dielectric films, and the vias may be disposed between the metal layers to electrically connect the metal layers. The metal layers and the vias may be formed from copper, aluminum, or alloys thereof.

Referring to FIG. 2 again, the second top metal layer 250 is disposed in the dielectric layer 254 of the second dielectric layer structure 248. The second bonding structure 244 is disposed on the second dielectric structure 248 and the second top metal layer 250. In some exemplary examples, a top surface 256 of the second top metal layer 250 is not covered by the dielectric layer 254. The second top metal layer 250 may be formed from copper, aluminum, or alloys thereof.

In some examples, the second bonding structure 244 may further include a second composite insulation structure 260 and a second barrier layer 262. In some examples, the second composite insulation structure 260 includes a second silicon oxide layer 264 and a second silicon oxy-nitride layer 266, in which the second silicon oxide layer 264 is disposed over the second substrate 242, and the second silicon oxy-nitride layer 266 is disposed on and covers the second silicon oxide layer 264. In some embodiments, the second silicon oxide layer 264 may have a thickness of about 3000 angstroms, and the second silicon oxy-nitride layer 266 may have a thickness of about 750 angstroms. The second silicon oxy-nitride layer 266 may have a reflectivity ranging from about 2.0 to about 2.4. The second silicon oxy-nitride layer 266 may have an extinction coefficient ranging from about 0.4 to about 0.6.

As shown in FIG. 2, the second conductive bonding layer 246 is disposed in the second silicon oxide layer 264 and the second silicon oxy-nitride layer 266, and is located over the second top metal layer 250. In some exemplary examples, the second conductive bonding layer 246 is a redistribution layer. The second conductive bonding layer 246 may be formed from copper, aluminum, or alloys thereof. A top surface 272 of the second conductive bonding layer 246 is at a third elevation, and a top surface 274 of the second silicon oxy-nitride layer 266 is at a fourth elevation. In some exemplary examples, a result of the third elevation minus the fourth elevation ranges from about −50 angstroms to about 100 angstroms. In certain examples, a result of the third elevation minus the fourth elevation ranges from about −30 angstroms to about 50 angstroms. While the result of the third elevation minus the fourth elevation is positive, the third elevation is higher than the fourth elevation; and while the result of the third elevation minus the fourth elevation is negative, the third elevation is lower than the fourth elevation.

In the shown embodiment, the second barrier layer 262 is disposed in the second silicon oxide layer 264 and the second silicon oxy-nitride layer 266, and conformally covers a sidewall 268 and a bottom 270 of the second conductive bonding layer 246, and the second barrier layer 262 is disposed between the second conductive bonding layer 246 and the second top metal layer 250, between the second conductive bonding layer 246 and the second silicon oxide layer 264, and between the second conductive bonding layer 246 and the second silicon oxy-nitride layer 266, such that the second barrier layer 262 contacts with the second top metal layer 250, the second silicon oxide layer 264 and the second silicon oxy-nitride layer 266. The second barrier layer 262 may be formed from a compound including metal and nonmetal. In some embodiments, the second barrier layer 262 may have a thickness of about 200 angstroms.

In some examples, as shown in FIG. 2, the second semiconductor structure 204 may optionally include a second etch stop layer 276, which is disposed between the dielectric layer 254 of the second dielectric structure 248 over the second substrate 242 and the second bonding structure 244. The second barrier layer 262 is disposed in the second etch stop layer 276, such that the second barrier layer 262 contacts with the second etch stop layer 276. The second etch stop layer 276 may be formed from silicon nitride. The second etch stop layer 276 may have a thickness ranging from about 300 angstroms to about 750 angstroms.

A top layer of the first composite insulation structure 212 is the first silicon oxy-nitride layer 220, and a top layer of the second composite insulation structure 260 is the second silicon oxy-nitride layer 266. The top layers of the first composite insulation structure 212 and the second composite insulation structure 260 both are nitrogen-containing layers, such that after the first semiconductor structure 202 and the second semiconductor structure 204 are bonded together, the first silicon oxy-nitride layer 220 of the first composite insulation structure 212 and the second silicon oxy-nitride layer 266 of the second composite insulation structure 260 can effectively prevent materials of the first conductive bonding layer 216 and the second conductive bonding layer 246 from diffusing to the first composite insulation structure 212 and the second composite insulation structure 260 along an interface of the first conductive bonding layer 216 and the second conductive bonding layer 246.

Moreover, the first silicon oxide layer 218 and the second silicon oxide layer 264 may be a high density plasma chemical vapor deposition layer, such that the first silicon oxide layer 218 and the second silicon oxide layer 264 are denser. The denser first silicon oxide layer 218 and the denser second silicon oxide layer 264 have less water content, which may increase adhesion of the first semiconductor structure 202 and the second semiconductor structure 204.

Figure 3C:
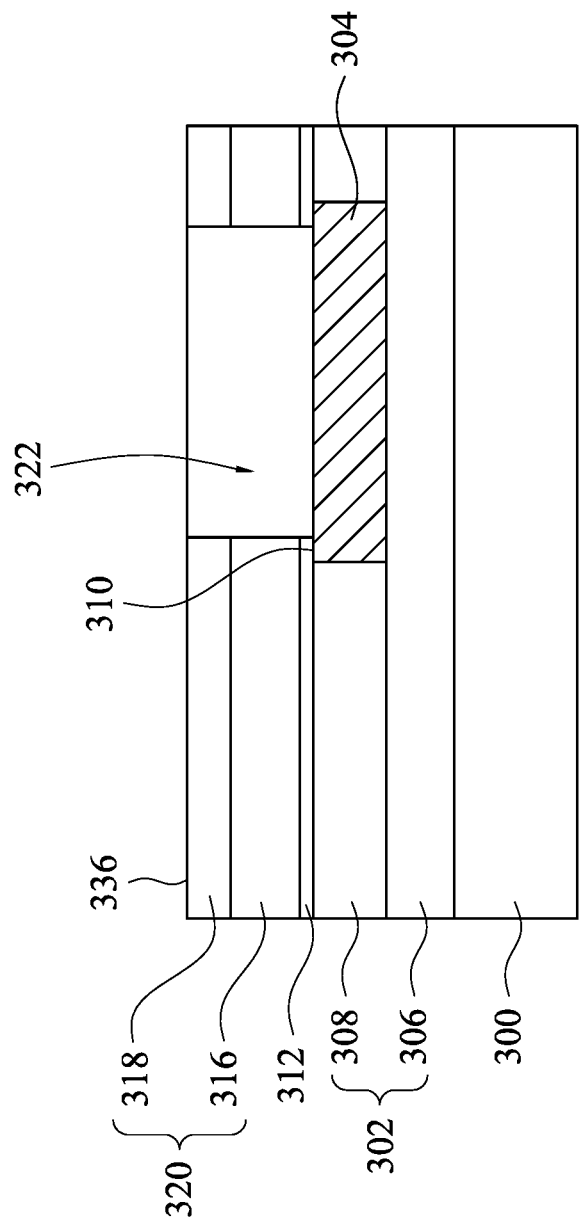

FIG. 3A through FIG. 3D are schematic cross-sectional views of intermediate stages showing a method for manufacturing a semiconductor device in accordance with various embodiments. As shown in FIG. 3A, a substrate 300 is provided. The substrate 300 may be a semiconductor substrate. The substrate 300 may be composed of a single-crystalline semiconductor material or a compound semiconductor material. For example, silicon or germanium may be used as a material forming the substrate 300.

In some examples, referring to FIG. 3A again, a dielectric structure 302 and a top metal layer 304 are formed on the substrate 300. The dielectric structure 302 may be firstly formed on the substrate 300, and the top metal layer 304 may be formed in the dielectric structure 302. In some exemplary examples, the dielectric structure 302 is formed to include various dielectric layers, which are stacked in sequence. In some exemplary examples, as shown in FIG. 3A, the dielectric structure 302 is formed to include at least two dielectric layers 306 and 308, in which the dielectric layer 306 is formed on the substrate 300, and the dielectric layer 308 is formed on the dielectric layer 306. The dielectric layers 306 and 308 may be formed from silicon nitride, silicon carbide, silicon oxide, a low dielectric constant dielectric material, or combinations thereof. In addition, the dielectric layers 306 and 306 may be formed by a chemical vapor deposition (CVD) method or a physical vapor deposition (PVD) method.

In some examples, the dielectric layer 306 may be formed to include various dielectric films stacked on each other. In some exemplary examples, various metal layers and various vias may be formed in the dielectric films, and the vias may be formed between the metal layers to electrically connect the metal layers. The metal layers and the vias may be formed from copper, aluminum, or alloys thereof.

The top metal layer 304 is formed in the dielectric layer 308 of the dielectric layer structure 302. In some exemplary examples, forming the top metal layer 304 includes forming a hole in the dielectric layer 308, forming a metal material on the dielectric layer 308 and filling the hole, and removing a portion of the metal material on the dielectric layer 308 to form the top metal layer 304. The hole may be formed by using a photolithography method and an etching method. The metal material may be formed by using a deposition method or an electroplating method. The portion of the metal material on the dielectric layer 308 may be removed by using a chemical mechanical polishing (CMP) method. The top metal layer 304 may be formed from copper, aluminum, or alloys thereof.

In some examples, after the dielectric structure 302 and the top metal layer 304 are completed, an etch stop layer 312 may be optionally formed on the dielectric structure 302 and the top metal layer 304. In some exemplary examples, the etch stop layer 312 may be formed by using a plasma enhanced chemical vapor deposition (PECVD) method. The etch stop layer 312 may be formed from silicon nitride. The etch stop layer 312 may be formed to have a thickness ranging from about 300 angstroms to about 750 angstroms. The etch stop layer 312 is configured to be a stop layer for a subsequent etching process which is performed on a structure above the etch stop layer 312.

Figure 3D:
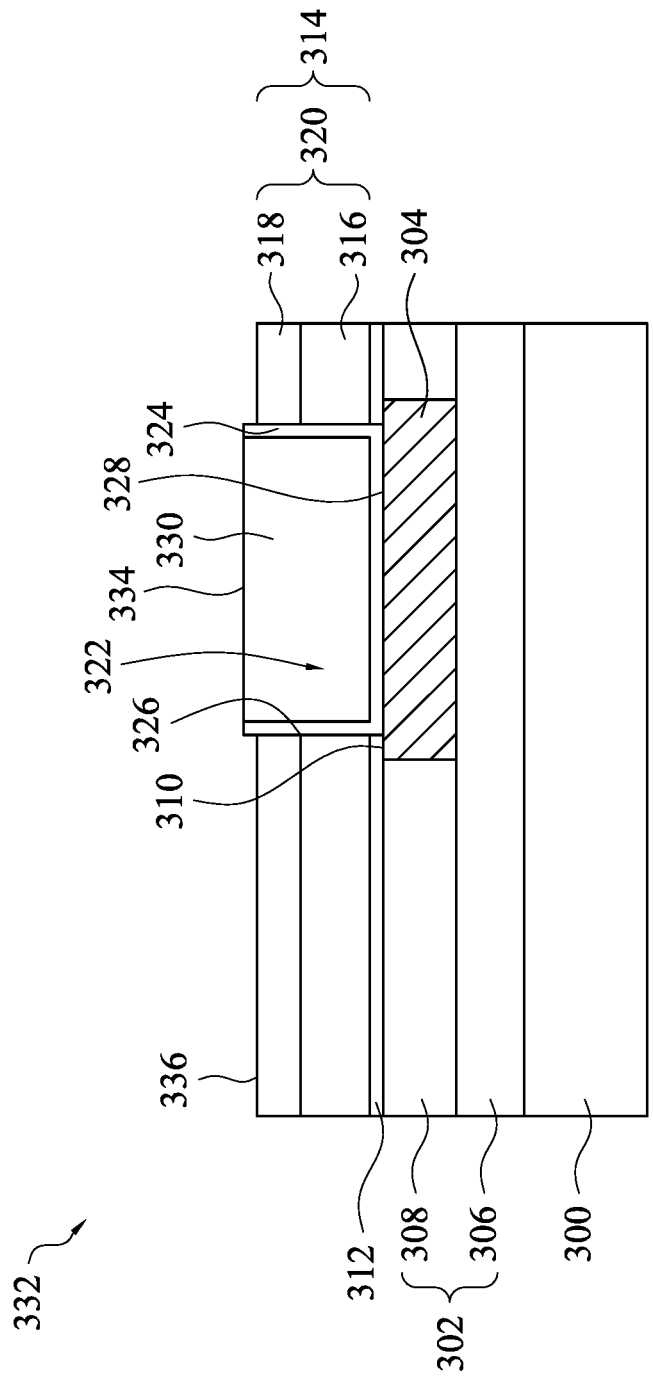

As shown in FIG. 3D, a bonding structure 314 is formed on the dielectric structure 302 and the top metal layer 304. In some examples, as shown in FIG. 3B, in the formation of the bonding structure 314, a silicon oxide layer 316 is formed on the etch stop layer 312 above the dielectric structure 302 and the top metal layer 304. In some exemplary examples, the silicon oxide layer 316 is formed by using a high density plasma chemical vapor deposition (HDP CVD) method. By using the high density plasma chemical vapor deposition method, the silicon oxide layer 316 is denser. The silicon oxide layer 316 may be formed to have a thickness of about 3000 angstroms. In certain examples, after the deposition of the silicon oxide layer 316, a planarization process may be optionally performed on the silicon oxide layer 316 to form the silicon oxide layer 316 with a planar top surface. The planarization process may be performed by using a chemical mechanical polishing method.

After the silicon oxide layer 316 is completed, the formation of the bonding structure 314 is proceeding to form a silicon oxy-nitride layer 318 on the silicon oxide layer 316 and covering the silicon oxide layer 316. The silicon oxy-nitride layer 318 is stacked on the silicon oxide layer 316 to form a composite insulation structure 320, as shown in FIG. 3B. In some examples, the silicon oxy-nitride layer 318 is formed by using a plasma-enhanced chemical vapor deposition (PECVD) method. In some exemplary examples, the formation of the silicon oxy-nitride layer 318 may be performed by applying plasma, and using $SiH_4$ and $N_2O$ as reaction gases, and using $N_2$ as carrier gas. Products of the reaction are $SiO_xN_y$ and $N_2$, in which x>0 and y>0. In some exemplary examples, in the process for forming the silicon oxy-nitride layer 318, a flow rate of $SiH_4$ may range from about 250 sccm to about 350 sccm, a flow rate of the $N_2O$ may range from about 750 sccm to about 950 sccm, a flow rate of $N_2$ may range from about 16000 sccm to about 20000 sccm, a radio frequency (RF) power may range from about 400 W to about 550 W, and a pressure may be range from about 1.6 torr to 2 torr. The silicon oxy-nitride layer 318 may be formed to have a thickness of about 3000 angstroms after the deposition is completed. In addition, the silicon oxy-nitride layer 318 may be formed to have a reflectivity ranging from about 2.0 to about 2.4, and an extinction coefficient ranging from about 0.4 to about 0.6.

As shown in FIG. 3C, a through hole 322 is formed in the silicon oxide layer 316, the silicon oxy-nitride layer 318 and the etch stop layer 312, in which the through hole 322 enables access to a portion of the top surface 310 of the top metal layer 304 through the silicon oxide layer 316, the silicon oxy-nitride layer 318, and the etch stop layer 312. The through hole 322 may be formed by using a photolithography method and an etching method, such as a dry etching method. In some exemplary examples, in the formation of the through hole 322, a dry etching process is performed on the silicon oxide layer 316 and the silicon oxy-nitride layer 318 to remove a portion of the silicon oxide layer 316 and a portion of the silicon oxy-nitride layer 318 to expose a portion of the etch stop layer 312, and then an over-etching process is performed on the portion of the etch stop layer 312 to remove the portion of the etch stop layer 312 and to expose the top surface 310 of the top metal layer 304.

After the through hole 322 is formed, as shown in FIG. 3D, a barrier layer 324 is formed to cover a sidewall 326 and a bottom 328 of the through hole 322, such that the barrier layer 324 covers the top surface 310 of the top metal layer 304, a portion of the etch stop layer 312, a portion of the silicon oxide layer 316, and a portion of the silicon oxy-nitride layer 318. The barrier layer 324 may conformally cover the sidewall 326 and the bottom 328 of the through hole 322. In some exemplary examples, the barrier layer 324 is formed by using a sputtering method. The barrier layer 324 may be formed from a compound including metal and nonmetal. The barrier layer 324 may be formed to have a thickness of about 200 angstroms.

Referring to FIG. 3D again, a conductive bonding layer 330 is formed on the barrier layer 324 and filling the through hole 322 to complete a semiconductor device 332. The conductive bonding layer 330 may be formed by using an electroplating method. In some exemplary examples, forming the conductive bonding layer 330 includes forming a conductive material of the conductive bonding layer 330 on the barrier layer 324 and the silicon oxy-nitride layer 318 and filling the through hole 322, and removing a portion of the conductive material on the silicon oxy-nitride layer 318 to form the conductive bonding layer 330. The portion of the conductive material on the silicon oxy-nitride layer 318 may be removed by using a chemical mechanical polishing method. During removing the portion of the conductive material on the silicon oxy-nitride layer 318, a portion of the silicon oxy-nitride layer 318 may be removed to thin the silicon oxy-nitride layer 318. After the formation of the conductive bonding layer 330, the silicon oxy-nitride layer 318 may have a thickness of about 750 angstroms. The conductive bonding layer 330 may be a redistribution layer. In addition, the conductive bonding layer 330 may be formed from copper, aluminum, or alloys thereof.

In some examples, the conductive bonding layer 330 is formed to have a top surface 334 at a first elevation, and the silicon oxy-nitride layer 318 is formed to have a top surface 336 at a second elevation. In some exemplary examples, a result of the first elevation minus the second elevation ranges from about −50 angstroms to about 100 angstroms. In certain examples, a result of the first elevation minus the second elevation ranges from about −30 angstroms to about 50 angstroms.

The silicon oxy-nitride layer 318 is harder than a conventional insulation layer which is typically formed from polymer, such that the provision of the silicon oxy-nitride layer 318 may contribute to the reduction of step/elevation variation between the top surface 334 of the conductive bonding layer 330 and the top surface 336 of the silicon oxy-nitride layer 318. Accordingly, the uniformity of a bonding area on the composite insulation structure 320 and the conductive bonding layer 330 may be improved, thereby enhancing a bonding effect of the semiconductor device 332 and another semiconductor device bonded thereto.

Figure 4:
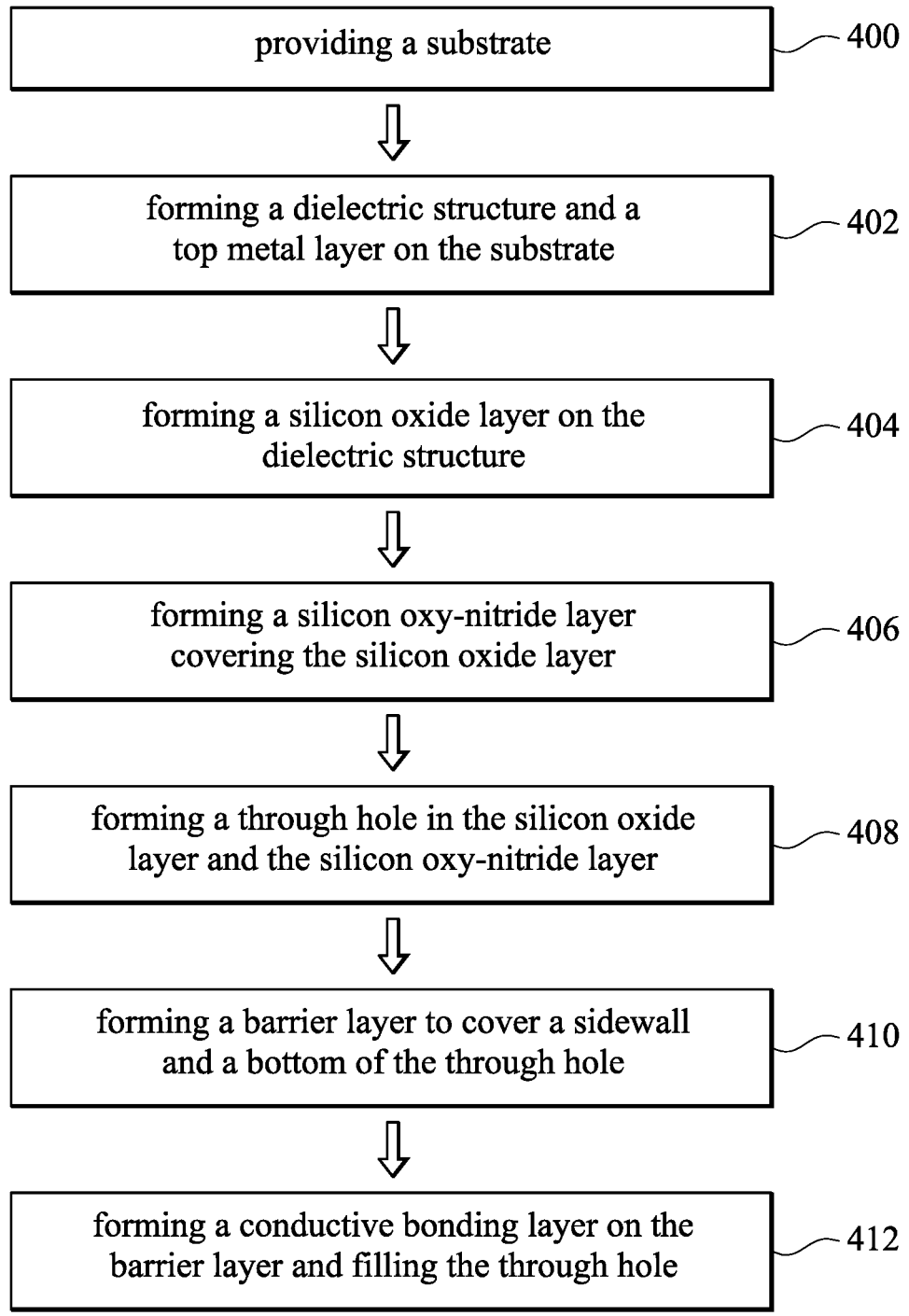
FIG. 4 is a flow chart of a method for manufacturing a semiconductor device in accordance with various embodiments.

Referring to FIG. 4 with FIG. 3A through FIG. 3D, FIG. 4 is a flow chart of a method for manufacturing a semiconductor device in accordance with various embodiments. The method begins at operation 400, where a substrate 300 is provided. The substrate 300 may be a semiconductor substrate, such as a single-crystalline semiconductor substrate or a compound semiconductor substrate. For example, silicon or germanium may be used as a material forming the substrate 300.

At operation 402, a dielectric structure 302 and a top metal layer 304 are formed on the substrate 300. The dielectric structure 302 may be formed on the substrate 300, and then the top metal layer 304 may be formed in the dielectric structure 302. In some exemplary examples, as shown in FIG. 3A, the dielectric structure 302 is formed to include at least two dielectric layers 306 and 308, in which the dielectric layer 306 is formed on the substrate 300, and the dielectric layer 308 is formed on the dielectric layer 306. The dielectric layers 306 and 306 may be formed by a chemical vapor deposition method or a physical vapor deposition method. The dielectric layers 306 and 308 may be formed from silicon nitride, silicon carbide, silicon oxide, a low dielectric constant dielectric material, or combinations thereof.

In some exemplary examples, the dielectric layer 306 may be formed to include various dielectric films stacked on each other, various metal layers and various vias may be formed in the dielectric films, and the vias may be formed between the metal layers to electrically connect the metal layers. The metal layers and the vias may be formed from copper, aluminum, or alloys thereof.

The top metal layer 304 is formed in the dielectric layer 308 of the dielectric layer structure 302. In some exemplary examples, forming the top metal layer 304 includes forming a hole in the dielectric layer 308, forming a metal material on the dielectric layer 308 and filling the hole, and removing a portion of the metal material on the dielectric layer 308 to form the top metal layer 304. The hole may be formed by using a photolithography method and an etching method, the metal material may be formed by using a deposition method or an electroplating method, and the portion of the metal material on the dielectric layer 308 may be removed by using a chemical mechanical polishing method. The top metal layer 304 may be formed from copper, aluminum, or alloys thereof.

In some examples, after the dielectric structure 302 and the top metal layer 304 are completed, an etch stop layer 312 may be optionally formed on the dielectric structure 302 and the top metal layer 304 by using a plasma enhanced chemical vapor deposition method. The etch stop layer 312 may be formed from silicon nitride. The etch stop layer 312 may be formed to have a thickness ranging from about 300 angstroms to about 750 angstroms.

As shown in FIG. 3D, a bonding structure 314 is formed on the dielectric structure 302 and the top metal layer 304. In some examples, at operation 404, as shown in FIG. 3B, in the formation of the bonding structure 314, a silicon oxide layer 316 is formed on the etch stop layer 312 above the dielectric structure 302 and the top metal layer 304 by using a high density plasma chemical vapor deposition method. The silicon oxide layer 316 may be formed to have a thickness of about 3000 angstroms. In certain examples, after the deposition of the silicon oxide layer 316, a planarization process may be optionally performed on the silicon oxide layer 316 to form the silicon oxide layer 316 with a planar top surface. The planarization process may be performed by using a chemical mechanical polishing method.

At operation 406, the formation of the bonding structure 314 is proceeding to form a silicon oxy-nitride layer 318 on the silicon oxide layer 316 and covering the silicon oxide layer 316 to complete a composite insulation structure 320, as shown in FIG. 3B. In some examples, the silicon oxy-nitride layer 318 is formed by using a plasma-enhanced chemical vapor deposition method. In some exemplary examples, the formation of the silicon oxy-nitride layer 318 may be performed by applying plasma, and using $SiH_4$ and $N_2O$ as reaction gases, and using $N_2$ as carrier gas. Products of the reaction are $SiO_xN_y$ and $N_2$, in which x>0 and y>0. In some exemplary examples, in the process for forming the silicon oxy-nitride layer 318, a flow rate of $SiH_4$ may range from about 250 sccm to about 350 sccm, a flow rate of the $N_2O$ may range from about 750 sccm to about 950 sccm, a flow rate of $N_2$ may range from about 16000 sccm to about 20000 sccm, a radio frequency power may range from about 400 W to about 550 W, and a pressure may be range from about 1.6 torr to 2 torr. The silicon oxy-nitride layer 318 may be formed to have a thickness of about 3000 angstroms after the deposition is completed. In addition, the silicon oxy-nitride layer 318 may be formed to have a reflectivity ranging from about 2.0 to about 2.4, and an extinction coefficient ranging from about 0.4 to about 0.6.

At operation 408, as shown in FIG. 3C, a through hole 322 is formed in the silicon oxide layer 316, the silicon oxy-nitride layer 318 and the etch stop layer 312. The through hole 322 may be formed by using a photolithography method and an etching method, such as a dry etching method. In some exemplary examples, in the formation of the through hole 322, a dry etching process is performed on the silicon oxide layer 316 and the silicon oxy-nitride layer 318 to remove a portion of the silicon oxide layer 316 and a portion of the silicon oxy-nitride layer 318 to expose a portion of the etch stop layer 312, and then an over-etching process is performed on the portion of the etch stop layer 312 to remove the portion of the etch stop layer 312.

At operation 410, as shown in FIG. 3D, a barrier layer 324 is formed to cover a sidewall 326 and a bottom 328 of the through hole 322 by using a sputtering method, such that the barrier layer 324 covers a top surface 310 of the top metal layer 304, a portion of the etch stop layer 312, a portion of the silicon oxide layer 316, and a portion of the silicon oxy-nitride layer 318. The barrier layer 324 may conformally cover the sidewall 326 and the bottom 328 of the through hole 322. The barrier layer 324 may be formed from a compound including metal and nonmetal. The barrier layer 324 may be formed to have a thickness of about 200 angstroms.

At operation 412, as shown in FIG. 3D, a conductive bonding layer 330 is formed on the barrier layer 324 and filling the through hole 322 to complete a semiconductor device 332 by using an electroplating method. In some exemplary examples, forming the conductive bonding layer 330 includes forming a conductive material of the conductive bonding layer 330 on the barrier layer 324 and the silicon oxy-nitride layer 318 and filling the through hole 322, and removing a portion of the conductive material on the silicon oxy-nitride layer 318 to form the conductive bonding layer 330. The portion of the conductive material on the silicon oxy-nitride layer 318 may be removed by using a chemical mechanical polishing method. During removing the portion of the conductive material on the silicon oxy-nitride layer 318, a portion of the silicon oxy-nitride layer 318 may be removed. After the formation of the conductive bonding layer 330, the silicon oxy-nitride layer 318 may have a thickness of about 750 angstroms. In addition, the conductive bonding layer 330 may be formed from copper, aluminum, or alloys thereof.

In some examples, the conductive bonding layer 330 is formed to have a top surface 334 at a first elevation, and the silicon oxy-nitride layer 318 is formed to have a top surface 336 at a second elevation. In some exemplary examples, a result of the first elevation minus the second elevation ranges from about −50 angstroms to about 100 angstroms. In certain examples, a result of the first elevation minus the second elevation ranges from about −30 angstroms to about 50 angstroms.

In accordance with an embodiment, the present disclosure discloses a semiconductor device. The semiconductor device includes a substrate, a dielectric structure, a top metal layer and a bonding structure. The dielectric structure is disposed on the substrate. The top metal layer is disposed in the dielectric structure. The bonding structure is disposed on the dielectric structure and the top metal layer. The bonding structure includes a silicon oxide layer, a silicon oxy-nitride layer, a conductive bonding layer and a barrier layer. The silicon oxide layer is disposed on the dielectric structure. The silicon oxy-nitride layer covers the silicon oxide layer. The conductive bonding layer is disposed in the silicon oxide layer and the silicon oxy-nitride layer. The barrier layer covers a sidewall and a bottom of the conductive bonding layer.

In accordance with another embodiment, the present disclosure discloses a semiconductor device. The semiconductor device includes a first semiconductor structure and a second semiconductor structure. The first semiconductor structure includes a first substrate and a first bonding structure. The first bonding structure is disposed over the first substrate. The first bonding structure includes a first silicon oxide layer, a first silicon oxy-nitride layer, a first conductive bonding layer and a first barrier layer. The first silicon oxide layer is disposed over the first substrate. The first silicon oxy-nitride layer covers the first silicon oxide layer. The first conductive bonding layer is disposed in the first silicon oxide layer and the first silicon oxy-nitride layer. The first barrier layer covers a sidewall and a bottom of the first conductive bonding layer. The second semiconductor structure includes a second substrate and a second bonding structure. The second bonding structure is disposed over the second substrate and bonded to the first bonding structure, in which the second bonding structure comprises a second conductive bonding layer which is disposed in the second bonding structure and is bonded to the first conductive bonding layer.

In accordance with yet another embodiment, the present disclosure discloses a method for manufacturing a semiconductor device. In this method, a substrate is provided. A dielectric structure and a top metal layer are formed on the substrate. The top metal layer is formed in the dielectric structure. A bonding structure is formed on the dielectric structure and the top metal layer. In the forming of the bonding structure, a silicon oxide layer is formed on the dielectric structure, a silicon oxy-nitride layer is formed to cover the silicon oxide layer, a through hole is formed in the silicon oxide layer and the silicon oxy-nitride layer, a barrier layer is formed to cover a sidewall and a bottom of the through hole, and a conductive bonding layer is formed on the barrier layer and filling the through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a dielectric structure disposed on the substrate;
   a top metal layer disposed in the dielectric structure; and
   a bonding structure disposed on the dielectric structure and the top metal layer, and the bonding structure comprising:
   a silicon oxide layer disposed on the dielectric structure;
   a silicon oxy-nitride layer covering the silicon oxide layer, wherein the silicon oxide layer has a high density plasma chemical vapor deposition portion in direct contact with the silicon oxy-nitride layer;
   a conductive bonding layer disposed in the silicon oxide layer and the silicon oxy-nitride layer; and
   a barrier layer covering a sidewall and a bottom of the conductive bonding layer.

2. The semiconductor device of claim 1, wherein a top surface of the conductive bonding layer is at a first elevation, a top surface of the silicon oxy-nitride layer is at a second elevation, and the first elevation is higher than the second elevation.

3. The semiconductor device of claim 1, wherein a top surface of the conductive bonding layer is at a first elevation, a top surface of the silicon oxy-nitride layer is at a second elevation, and the first elevation is lower than the second elevation.

4. The semiconductor device of claim 1, wherein the conductive bonding layer is a redistribution layer.

5. The semiconductor device of claim 1, further comprising an etch stop layer disposed between the dielectric structure and the bonding structure, wherein the barrier layer is disposed in the etch stop layer.

6. The semiconductor device of claim 5, wherein the etch stop layer is formed from silicon nitride.

7. A semiconductor device, comprising:
   a first semiconductor structure comprising:
   a first substrate;
   an etch stop layer over the first substrate; and
   a first bonding structure disposed over the etch stop layer, and the first bonding structure comprising:
   a first silicon oxide layer disposed over the first substrate;
   a first silicon oxy-nitride layer covering the first silicon oxide layer, wherein the first silicon oxide layer has a high density plasma chemical vapor deposition portion extending from the first silicon oxy-nitride layer to the etch stop layer;
   a first conductive bonding layer disposed in the first silicon oxide layer and the first silicon oxy-nitride layer; and
   a first barrier layer covering a sidewall and a bottom of the first conductive bonding layer; and
   a second semiconductor structure comprising:
   a second substrate; and
   a second bonding structure disposed over the second substrate and bonded to the first bonding structure, wherein the second bonding structure comprises a second conductive bonding layer which is disposed in the second bonding structure and is bonded to the first conductive bonding layer.

8. The semiconductor device of claim 7, wherein a top surface of the first conductive bonding layer is at a first elevation, a top surface of the first silicon oxy-nitride layer is at a second elevation, and the first elevation is higher than the second elevation.

9. The semiconductor device of claim 7, wherein a top surface of the first conductive bonding layer is at a first elevation, a top surface of the first silicon oxy-nitride layer is at a second elevation, and the first elevation is lower than the second elevation.

10. The semiconductor device of claim 7, wherein the first semiconductor structure further comprises:
 a first dielectric structure disposed on the first substrate; and
 a first top metal layer disposed in the first dielectric structure, wherein the first bonding structure is disposed on the first dielectric structure and the first top metal layer.

11. The semiconductor device of claim 7, wherein the second semiconductor structure further comprises:
 a second dielectric structure disposed on the second substrate; and
 a second top metal layer disposed in the second dielectric structure, wherein the second bonding structure is disposed on the second dielectric structure and the second top metal layer.

12. The semiconductor device of claim 11, wherein the second bonding structure further comprises:
 a second silicon oxide layer disposed on the second substrate;
 a second silicon oxy-nitride layer covering the second silicon oxide layer; and
 a second barrier layer covering a sidewall and a bottom of the second conductive bonding layer, wherein the second barrier layer and the second conductive bonding layer is disposed in the second silicon oxide layer and the second silicon oxy-nitride layer.

13. The semiconductor device of claim 12, wherein a top surface of the second conductive bonding layer is at a third elevation, a top surface of the second silicon oxy-nitride layer is at a fourth elevation, and the third elevation is higher than or lower than the fourth elevation.

14. The semiconductor device of claim 1, wherein the silicon oxy-nitride layer has an extinction coefficient substantially ranging from 0.4 to 0.6.

15. The semiconductor device of claim 1, wherein the barrier layer conformally covers the sidewall and the bottom of the conductive bonding layer.

16. The semiconductor device of claim 5, wherein the conductive bonding layer is separated from the silicon oxide layer, the silicon oxy-nitride layer, the etch stop layer, and the top metal layer by the barrier layer.

17. The semiconductor device of claim 7, wherein the first silicon oxy-nitride layer has a reflectivity substantially ranging from 2.0 to 2.4, and an extinction coefficient substantially ranging from 0.4 to 0.6.

18. The semiconductor device of claim 7, wherein the first barrier layer conformally covers the sidewall and the bottom of the first conductive bonding layer.

19. The semiconductor device of claim 7, wherein the first conductive bonding layer is separated from the first silicon oxide layer, the first silicon oxy-nitride layer, and the first substrate by the first barrier layer.

20. A semiconductor device, comprising:
 a substrate;
 a dielectric structure disposed on the substrate;
 a top metal layer disposed in the dielectric structure; and
 a bonding structure disposed on the dielectric structure and the top metal layer, and the bonding structure comprising:
 a silicon oxide layer disposed on the dielectric structure, wherein an entirety of the silicon oxide layer is a high density plasma chemical vapor deposition layer;
 a silicon oxy-nitride layer covering the silicon oxide layer and physically contacting the silicon oxide layer;
 a conductive bonding layer disposed in the silicon oxide layer and the silicon oxy-nitride layer; and
 a barrier layer covering a sidewall and a bottom of the conductive bonding layer.

* * * * *